United States Patent
Zhao et al.

(10) Patent No.: US 11,844,181 B2
(45) Date of Patent: Dec. 12, 2023

(54) COMPOSITE FRAME STRUCTURE, ELECTRONIC DEVICE, AND METHOD FOR MANUFACTURING THE COMPOSITE FRAME STRUCTURE

(71) Applicant: Fulian Yuzhan Precision Technology Co., Ltd, Shenzhen (CN)

(72) Inventors: Tao Zhao, Shenzhen (CN); Guan-Jun Zhang, Shenzhen (CN); Jian-Xiong Qian, Shenzhen (CN); Huai-Xing Zhang, Shenzhen (CN); Zhi-Liang Hu, Shenzhen (CN); Zong-Jing Li, Shenzhen (CN)

(73) Assignee: Fulian Yuzhan Precision Technology Co., Ltd, Shenzhen (CN)

( * ) Notice: Subject to any disclaimer, the term of this patent is extended or adjusted under 35 U.S.C. 154(b) by 414 days.

(21) Appl. No.: 17/036,528

(22) Filed: Sep. 29, 2020

(65) Prior Publication Data
US 2021/0153369 A1 May 20, 2021

(30) Foreign Application Priority Data

Nov. 15, 2019 (CN) .......................... 201911122508.8

(51) Int. Cl.
*H05K 5/02* (2006.01)
*G06F 1/16* (2006.01)

(52) U.S. Cl.
CPC ......... *H05K 5/0217* (2013.01); *G06F 1/1656* (2013.01); *Y10T 29/49986* (2015.01)

(58) Field of Classification Search
CPC .... H05K 5/0217; G06F 1/1656; H04M 1/026; Y10T 29/49986
See application file for complete search history.

(56) References Cited

U.S. PATENT DOCUMENTS

| 8,861,188 | B2 * | 10/2014 | Su | G06F 1/1637 |
| | | | | 455/575.1 |
| 10,821,494 | B2 * | 11/2020 | Zeng | B21D 13/02 |
| 10,821,638 | B2 * | 11/2020 | Huang | H04M 1/0202 |
| 2019/0070760 | A1 * | 3/2019 | Huang | H04M 1/0202 |

FOREIGN PATENT DOCUMENTS

| CN | 106425094 A | * | 2/2017 | |
| CN | 107666799 A | * | 2/2018 | ......... B29C 45/1418 |
| CN | 107666799 A | | 2/2018 | |
| EP | 3484251 A1 | * | 5/2019 | ............. B01D 35/00 |

OTHER PUBLICATIONS

Liao et al.; An Aluminum Alloy Handset Shell Laser Composite Welding Forming Device and Forming Technique Thereof; Feb. 22, 2017; English Machine Translation; pp. 1-5 (Year: 2023).*

* cited by examiner

*Primary Examiner* — Bayan Salone
(74) *Attorney, Agent, or Firm* — ScienBiziP, P.C.

(57) ABSTRACT

A composite frame structure includes a metal frame and a plastic frame. The metal frame is formed by enclosing a plurality of metal sheets. The plastic frame is combined with an inner surface of the metal frame, the plastic frame has an integrally formed structure. An electronic device having the composite frame structure and a method for manufacturing the composite frame structure are provided.

20 Claims, 7 Drawing Sheets

COMPOSITE FRAME STRUCTURE, ELECTRONIC DEVICE, AND METHOD FOR MANUFACTURING THE COMPOSITE FRAME STRUCTURE

FIELD

The subject matter herein generally relates to a composite frame structure, an electronic device having the composite frame structure, and a method for manufacturing the composite frame structure.

BACKGROUND

At present, housings of electronic devices such as mobile phones and tablet computers are usually metal to obtain a metal texture and a good strength. However, the housings made of metal are usually heavy.

Therefore, there is room for improvement within the art.

BRIEF DESCRIPTION OF THE DRAWINGS

Implementations of the present disclosure will now be described, by way of embodiments only, with reference to the attached figures.

DETAILED DESCRIPTION

Figure 1:
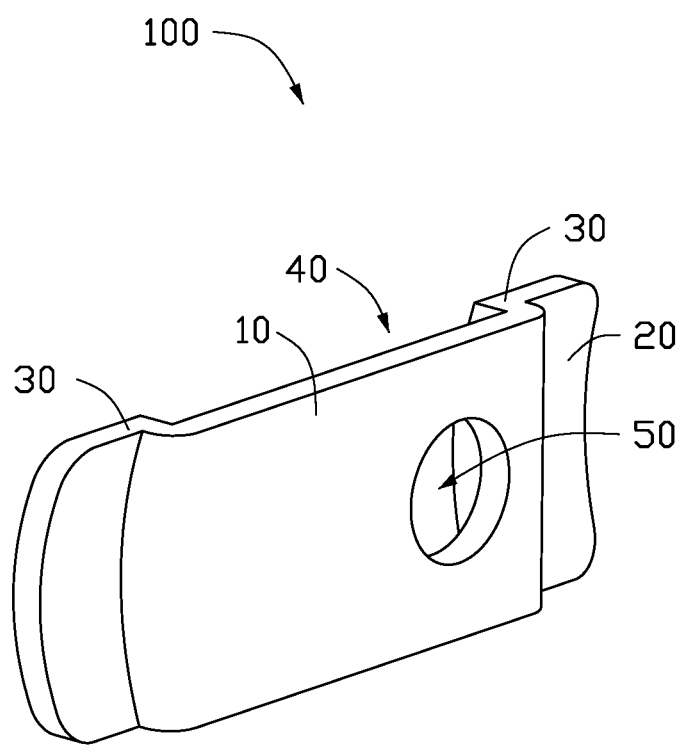
FIG. 1 is a diagram of an embodiment of a connecting member.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

The disclosure is illustrated by way of example and not by way of limitation in the figures of the accompanying drawings, in which like references indicate similar elements. It should be noted that references to "an" or "one" embodiment in this disclosure are not necessarily to the same embodiment, and such references mean "at least one".

The term "comprising," when utilized, means "including, but not necessarily limited to"; it specifically indicates open-ended inclusion or membership in the so-described combination, group, series, and the like.

FIG. 1 illustrates an embodiment of a connecting member 100. The connecting member 100 includes a substrate 10, two lugs 20, and two connecting parts 30, each connecting part connects the substrate 10 and one of the two lugs 20. The connecting parts 30 extend from two opposite ending portions of the substrate 10 to a same side, thereby form a receiving space 40 by the connecting parts 30 and the substrate 10. The connecting member 100 includes at least one hole 50 passing through the substrate 10. Each of the at least one hole 50 communicates with the receiving space 40 and the external environment. Each of the lugs 20 is connected to an ending portion of one of the connecting parts 30 away from the substrate 10 and extended away from the receiving space 40. The connecting member 100 is connected to a member to be injected through the lugs 20.

In at least one embodiment, the connecting member 100 may be made of metal.

In at least one embodiment, the connecting member 100 may include a substrate 10, two connecting parts 30, each of the two connecting parts 30 extending from each of two opposite sides of the substrate to a same side, thereby forming a receiving space 40 by the substrate and the two connecting parts 30 extending from each of two opposite sides of the substrate 10.

Figure 2:
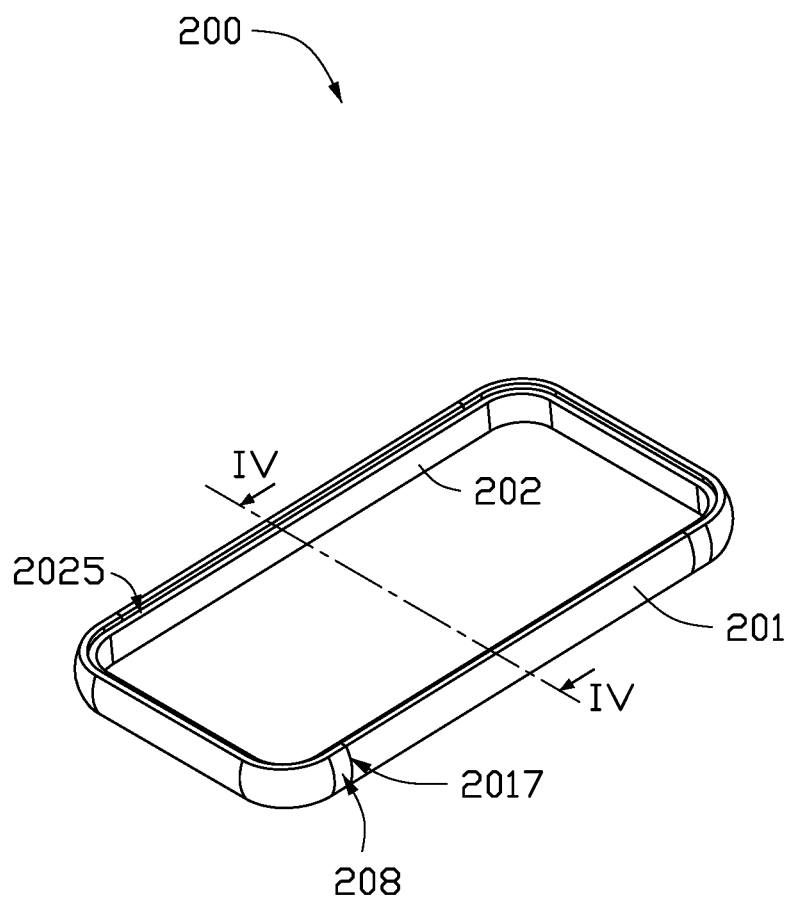
FIG. 2 is a diagram of an embodiment of a composite frame structure.
Figure 3:
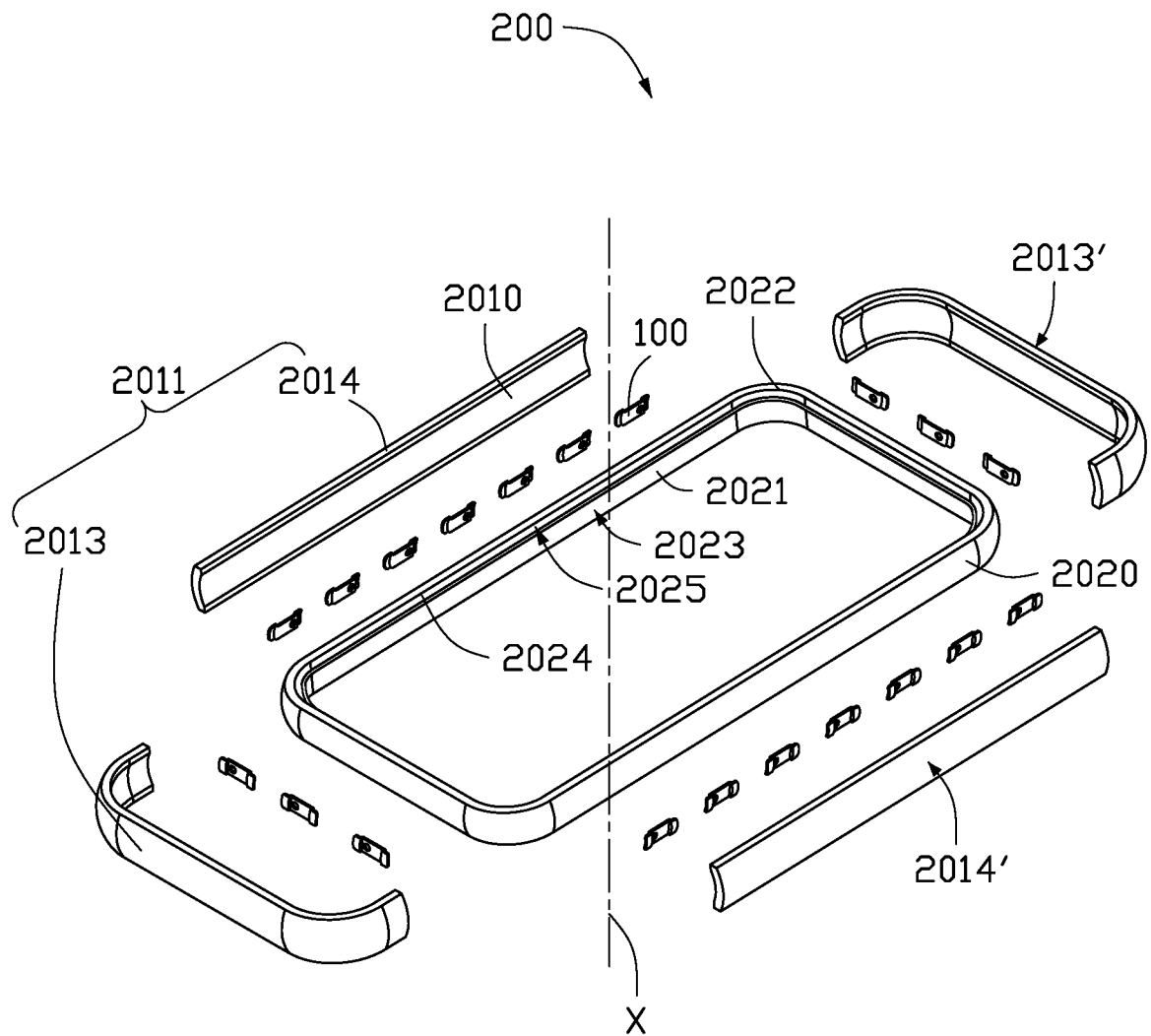
FIG. 3 is an exploded, diagrammatic view of the composite frame structure of FIG. 2.

FIG. 2 illustrates an embodiment of a composite frame structure 200. The composite frame structure 200 includes a metal frame 201 and a plastic frame 202. Referring to FIG. 3, the metal frame 201 includes a plurality of metal sheets 2011 connected end to end to enclose, so that the metal frame 201 may be annular. In at least one embodiment, the plastic frame 202 is annular. An outer surface 2020 of the plastic frame 202 facing the metal frame 201 is coupled to an inner surface 2010 of the metal frame 201. The plastic frame 202 is an integrally formed structure. Compared with an all-metal composite frame structure, a weight of the composite frame structure 200 adopting a combination of the metal frame 201 and the plastic frame 202 may be reduced while possessing a metallic feeling.

In at least one embodiment, the composite frame structure 200 further includes a plurality of the connecting members 100. Each of the connecting members 100 is set between the plastic frame 202 and the metal frame 201. The connecting member 100 is connected to the inner surface of the metal frame 201 by the lug 20. The plastic frame 202 further includes a plurality of fastening parts 2028 (shown in FIG. 4). Each of the plurality of the fastening parts 2028 extends from the plastic frame 202 and passes through one of the at least one hole (not shown in FIG. 4) and fills in the corresponding receiving space 40. Each of the plurality of the fastening parts 2028 is combined with the inner surface 2010 of the metal frame 201. The plurality of the connecting members 100 may enhance a bonding strength between the plastic frame 202 and the metal frame 201.

In at least one embodiment, the connecting member 100 is connected to the inner surface of the metal frame 201 by connecting parts 30.

In at least one embodiment, the at least one hole 50 may be omitted, and each of the fastening parts 2028 extends from the plastic frame 202 and fills the receiving space 40.

Figure 5:
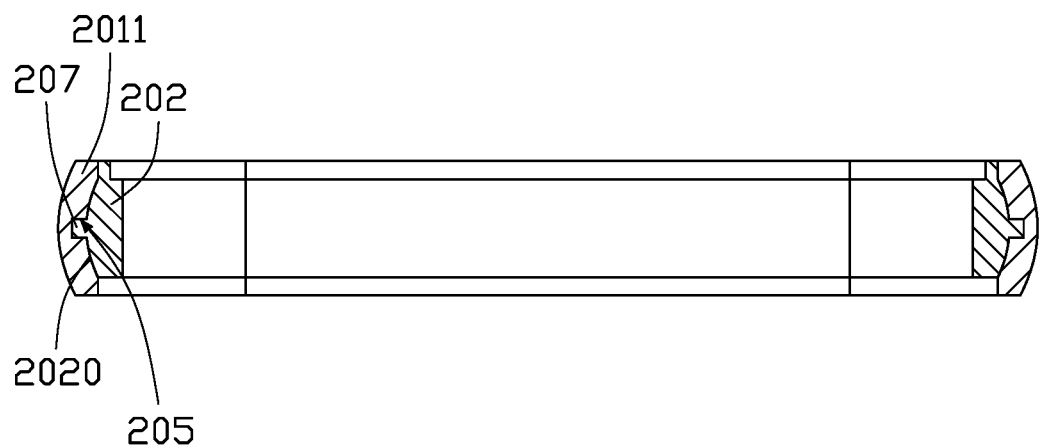
FIG. 5 is a cross-sectional view of another embodiment of the composite frame structure taken along line IV-IV of FIG. 2.

In at least one embodiment, referring to FIG. 5, at least one blind via 205 is formed in an inner surface of each of the plurality of metal sheets 2011, and at least one protrusion 207 is protruded from the outer surface 2020 of the plastic frame 202. The at least one protrusion 207 fills in the at least one blind via 205, thereby increasing a contact area between the inner surface of the plurality of metal sheets 2011 and the plastic frame 202, the bonding strength between the plastic frame 202 and the metal frame 201 may be increased.

In at least one embodiment, the plurality of metal sheets 2011 includes a first metal sheet 2014, a second metal sheet 2013, a third metal sheet 2014' opposite to the first metal sheet 2014, and a fourth metal sheet 2013' opposite to the second metal sheet 2013. The first metal sheet 2014 and the third metal sheet 2014' are substantially straight, and the second metal sheet 2013 and the fourth metal sheet 2013' are substantially U-shaped. The first metal sheet 2014, the second metal sheet 2013, the third metal sheet 2014' and the fourth metal sheet 2013' are connected end-to-end in order.

A gap 2017 is respectively formed between the first metal sheet 2014 and the second metal sheet 2013, between the second metal sheet 2013 and the third metal sheet 2014', between the third metal sheet 2014' and the fourth metal sheet 2013', and between the fourth metal sheet 2013' and the first metal sheet 2014. The plastic frame 202 further includes a filling portion 208 filled in each gap 2017 to connect the first metal sheet 2014 and the adjacent second metal sheet 2013, connect the second metal sheet 2013 and the third metal sheet 2014', connect the third metal sheet 2014' and the fourth metal sheet 2013', and connect the fourth metal sheet 2013' and the first metal sheet 2014, respectively. The filling portion 208 may reduce a risk of electromagnetic signals being shielded.

Figure 4:
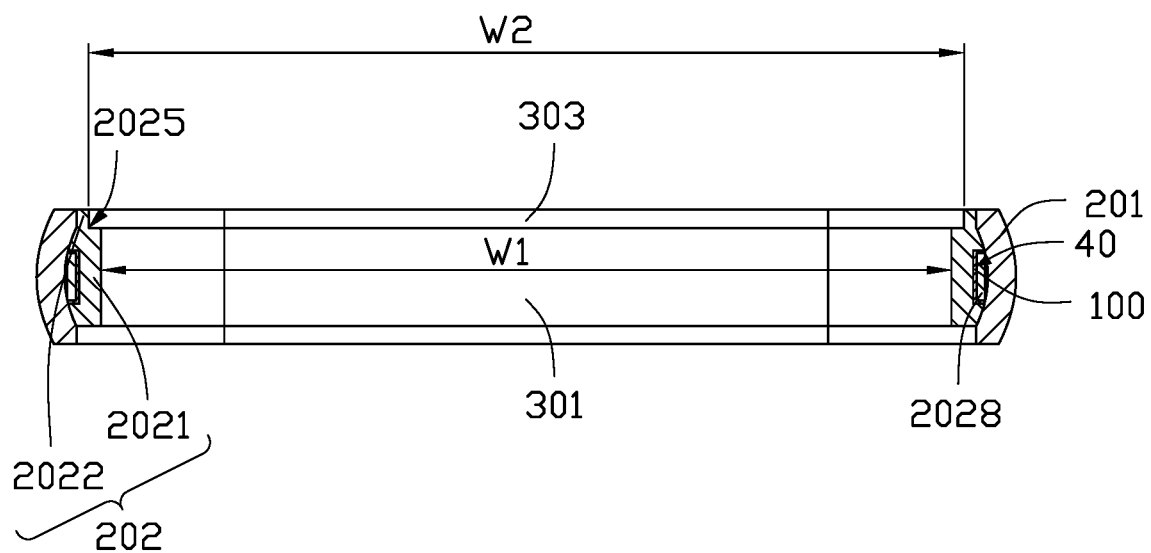
FIG. 4 is a cross-sectional view of an embodiment of the composite frame structure taken along line IV-IV of FIG. 2.

In at least one embodiment, referring to FIGS. 3 and 4, the plastic frame 202 includes a first frame portion 2021, a second frame portion 2022 on the first frame portion 2021 and a stepped portion 2025 formed at a junction of the first frame portion 2021 and the second frame portion 2022. The first frame portion 2021 is annular and arranged around an axis X. The second frame portion 2022 extends from the first frame portion 2021 along a direction of the axis X and arranged around the axis X. The first frame portion 2021 comprises a first inner surface 2023 surrounding the axis and forming a first through hole 301. The second frame portion 2022 comprises a second inner surface 2024 surrounding the axis and forming a second through hole 303. A width W1 of the first through hole 301 is less than a width W2 of the second through hole 303, thereby formed the stepped portion 2025.

In at least one embodiment, a thickness in a direction perpendicular to the axis of the metal frame ranges from 0.5 mm to 1.0 mm. In at least one embodiment, a thickness of the metal frame 201 is 0.8 mm.

Figure 6:
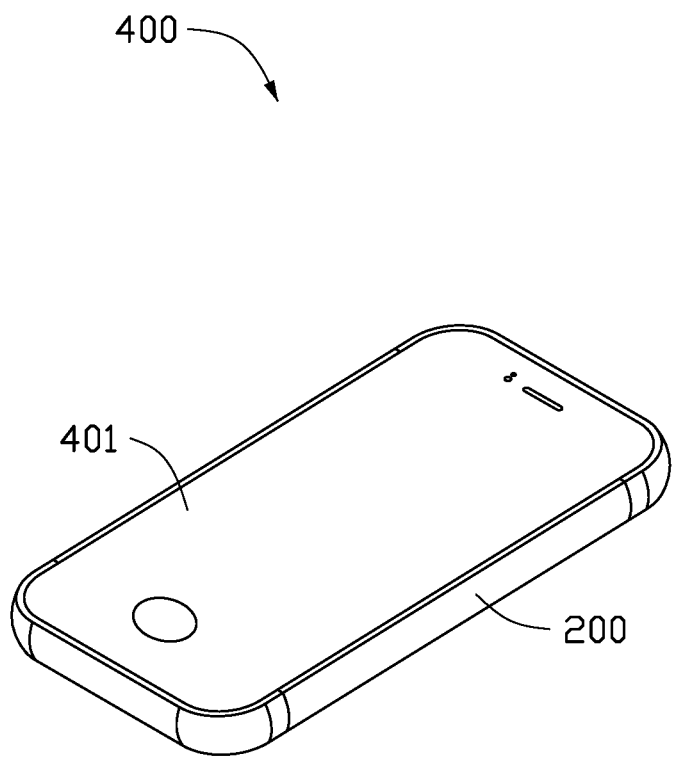
FIG. 6 is a diagram of an embodiment of an electronic device.

FIG. 6 illustrates an embodiment of an electronic device 400. The electronic device 400 includes the composite frame structure 200 and a display screen 401 mounted on the composite frame structure 200. A display screen 401 (shown in FIG. 6) may be received in the second through hole 303 and carried by the stepped portion 2025. Since the first frame portion 2021 and the second frame portion 2022 are made of plastic, the display screen 401 may be directly received in the second through hole 303 and disposed on the stepped portion 2025 without buffer material, thereby reducing a distance from an periphery of the display screen 401 to an outer periphery of the composite frame structure 200.

The electronic device 400 may be a mobile phone, a tablet computer, a notebook computer, a smart home appliance, or a vehicle electronic device.

Figure 7:
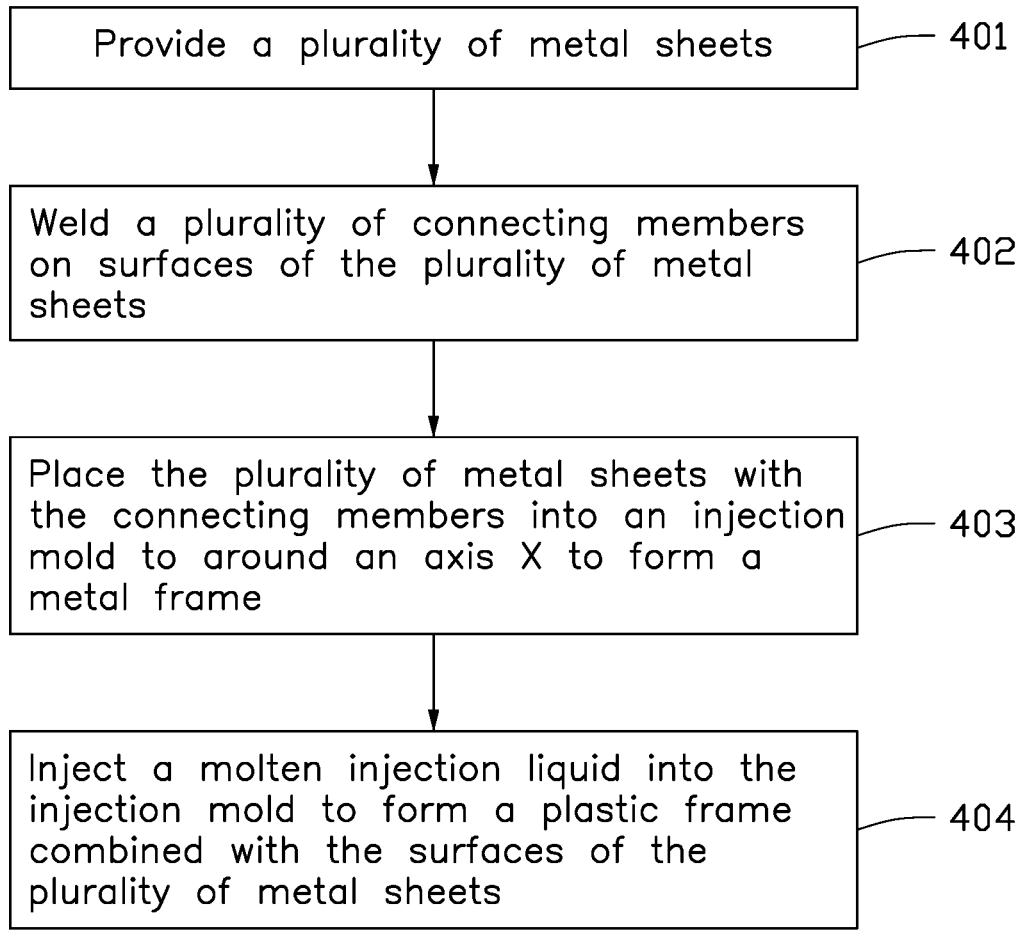
FIG. 7 is a flowchart of an embodiment of a method for manufacturing a composite frame structure.

FIG. 7 illustrates a flowchart of a method in accordance with an embodiment. The method for manufacturing a composite frame structure is provided by way of embodiments, as there are a variety of ways to carry out the method. Each block shown in FIG. 7 represents one or more processes, methods, or subroutines carried out in the method. Furthermore, the illustrated order of blocks can be changed. Additional blocks may be added or fewer blocks may be utilized, without departing from this disclosure. The method can begin at block 401.

At block 401, a plurality of metal sheets 2011 are provided.

At block 402, a plurality of connecting members 100 are welded on an surface of the plurality of metal sheets 2011. Each of the plurality of connecting members 100 includes a substrate 10, two lugs 20, and two connecting parts 30 connecting the substrate 10 and each of the lugs 20. The connecting parts 30 extend from two opposite ending portions of the substrate 10 to a same side, thereby forming a receiving space 40 by the connecting parts 30 and the substrate 10. The substrate 10 may further include at least one hole 50. Each of the at least one hole 50 communicates with the receiving space 40 and the external environment. Each of the lugs 20 is connected to an ending portion of one of the connecting parts 30 away from the substrate 10 and extends away from the receiving space 40.

In at least one embodiment, the lugs 20 of the plurality of connecting members 100 are welded on the surfaces of the plurality of metal sheets 2011. The receiving spaces 40 of the plurality of connecting members 100 face to the surfaces of the plurality of metal sheets 2011.

In at least one embodiment, a connecting member 100 is welded on an surface of each of the plurality of metal sheets 2011.

In at least one embodiment, a connecting member 100 is welded on an surface of at least one of the plurality of metal sheets 2011.

In at least one embodiment, the connecting members 100 are welded on an surface of each of the plurality of metal sheets 2011.

In at least one embodiment, the connecting members 100 are welded on an surface of at least one of the plurality of metal sheets 2011.

At block 403, the plurality of metal sheets 2011 with the plurality of connecting members 100 are placed into an injection mold 300 to form a metal frame 201. The metal frame 201 is annular. The surfaces of the plurality of metal sheets 2011 with the plurality of connecting members 100 faces an axis X and an inside of the injection mold.

Further, a gap 2017 may be formed between two adjacent metal sheets 2011.

In at least one embodiment, a thickness in a direction perpendicular to the axis X of the metal frame 201 ranges from 0.5 mm to 1.0 mm. In at least one embodiment, a thickness of each metal sheet 2011 is 0.8 mm.

At block 404, a molten injection liquid is injected into the injection mold 300 to form a plastic frame 202 combined with the surfaces of the plurality of metal sheets 2011.

Further, the plastic frame 202 may include a filling portion 208 filled in the gap 2017 to connect the two adjacent metal sheets 2011.

Further, a plurality of fastening parts 2028 extends from the plastic frame 202 to pass through the at least one hole 50 and fill the corresponding receiving space 40.

In at least one embodiment, the plurality of connecting members 100 are welded on inner surfaces of the plurality of metal sheets 2011 by irradiating laser to the metal sheet 2011 and a plurality of welding points on the lugs 20 of each connecting member 100 until the connecting member 100 and the metal sheet 2011 are fused at the plurality of welding points.

In at least one embodiment, the plurality of welding points on the two lugs 20 of each connecting member 100 are symmetrically arranged on the connecting member 100.

In at least one embodiment, parameters of the laser welding are shown in Table 1.

TABLE 1

| Type of laser | Focal length | Width of facula | Power |
|---|---|---|---|
| Fiber laser | 210 mm to 220 mm | 0.46 mm to 0.5 mm | 3 kW to 5 kW |

In at least one embodiment, before the plurality of connecting members 100 welded on surfaces of the plurality of metal sheets 2011, the method may further include recessing at least one blind via 205 from surfaces of the plurality of metal sheets 2011. When forming the plastic frame 202, the molten injection liquid fills the least one blind via 205 to form at least one protrusion 207.

In at least one embodiment, after block 404, the method may further include grinding and polishing, then painting the composite frame structure 200.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A method for manufacturing a composite frame structure comprising:
   providing a plurality of metal sheets;
   welding a plurality of connecting members on a surface of the plurality of metal sheets, wherein each of the plurality of connecting members comprises a substrate and a connecting part; the connecting part is extended from a side of the substrate, and a receiving space is formed by the substrate and the connecting part; the substrate comprises a hole, the hole communicates with the receiving space and an external environment;
   placing the plurality of metal sheets enclosed in an injection mold to form a metal frame, wherein the surface of the plurality of metal sheets with the plurality of connecting members faces an inside of the injection mold;
   injecting a molten injection liquid into the injection mold to form a plastic frame combined with the surface of the plurality of metal sheets and a plurality of fastening parts extending from the plastic frame to pass through the holes and filling the receiving spaces of the plurality of connecting members.

2. The method of claim 1, wherein the step of welding further comprises:
   arranging a plurality of welding points on each of the plurality of connecting members;
   irradiating a laser to the metal sheet and the plurality of welding points on each of the plurality of connecting members until the plurality of connecting members and the metal sheet are fused at the plurality of welding points.

3. The method of claim 1, further comprising:
   forming a blind via in the surface of the metal frame;
   wherein the step of injecting further comprises:
   filling the blind via with the molten injection liquid.

4. The method of claim 2, wherein each of the plurality of connecting members further comprises a lug, the lug is connected to an ending portion of the connecting part away from the substrate and extends away from the receiving space, the lug is welded on the surface of the plurality of metal sheets.

5. The method of claim 3, the plastic frame further comprises a protrusion, the protrusion is filled in the blind via.

6. The method of claim 1, wherein the surface of the plurality of metal sheets with the connecting member faces an axis, a thickness in a direction perpendicular to the axis of the metal frame ranges from 0.5 mm to 1.0 mm.

7. The method of claim 6, wherein a thickness in the direction perpendicular to the axis of each of the plurality of metal sheets is 0.8 mm.

8. The method of claim 1, wherein a gap is formed between two adjacent metal sheets, the plastic frame comprises a filling portion filled in the gap to connect the two adjacent metal sheets.

9. The method of claim 1, wherein the plurality of metal sheets comprise a first metal sheet and a second metal sheet adjacent to the first metal sheet, a gap is formed between the first metal sheet and the second metal sheet, the plastic frame further comprises a filling portion filled in the gap to connect the first metal sheet and the second metal sheet.

10. The method of claim 1, wherein the step of providing a plurality of metal sheets further comprise:
    providing a first metal sheet;
    a second metal sheet;
    a third metal sheet opposite to the first metal sheet;
    a fourth metal sheet opposite to the second metal sheet;
    wherein the first metal sheet and the third metal sheet are straight, the second metal sheet and the fourth metal sheet are U-shaped, the first metal sheet, the second metal sheet, the third metal sheet and the fourth metal sheet are connected end-to-end in order.

11. The method of claim 2, wherein a focal length of the laser is in a range of 210 mm to 220 mm.

12. The method of claim 11, wherein a width of facula of the laser is in a range of 0.46 mm to 0.5 mm.

13. The method of claim 11, wherein a power of the laser is in a range of 3 kW to 5 kW.

14. The method of claim 1, wherein after the step of forming the plastic frame combined with the surface of the plurality of metal sheets to obtain the composite frame structure, the method further comprises:
    grinding and polishing the composite frame structure.

15. The method of claim 14, wherein after the step of grinding and polishing, the method further comprises:
    painting the composite frame structure.

16. A method for manufacturing a composite frame structure comprising:
    providing a plurality of metal sheets;
    welding a connecting member on a surface of the plurality of metal sheets, wherein the connecting member comprises a substrate, a connecting part, and a lug; the connecting part is extended from a side of the substrate, and a receiving space is formed by the substrate and the connecting part; the lug is connected to an ending portion of the connecting part away from the substrate and extends away from the receiving space, the lug is welded on the surface of the plurality of metal sheets;

placing the plurality of metal sheets enclosed in an injection mold to form a metal frame, wherein the surface of the plurality of metal sheets with the connecting member faces an inside of the injection mold;

injecting a molten injection liquid into the injection mold to form a plastic frame combined with the surface of the plurality of metal sheets and filling in the receiving space.

17. The method of claim 16, wherein the step of welding further comprises:

arranging a plurality of welding points on the lug; and irradiating a laser to the metal sheet and the plurality of welding points on the lug until the lug and the metal sheet are fused at the plurality of welding points.

18. The method of claim 16, wherein the plastic frame comprises a first frame portion, a second frame portion, and a stepped portion formed at a junction of the first frame portion and the second frame portion; the first frame portion is annular and arranged around an axis, the second frame portion extends from the first frame portion along a direction of the axis and is arranged around the axis.

19. A method for manufacturing a composite frame structure comprising:

providing a plurality of metal sheets;

welding a connecting member on a surface of the plurality of metal sheets, wherein the connecting member defines a receiving space and a hole, the hole communicates with the receiving space and an external environment;

placing the plurality of metal sheets enclosed in an injection mold to form a metal frame, wherein the surface of the plurality of metal sheets with the connecting member faces an inside of the injection mold;

injecting a molten injection liquid into the injection mold to form a plastic frame combined with the surface of the plurality of metal sheets and a fastening part extending from the plastic frame to pass through the hole and filling the receiving space of the connecting member.

20. The method of claim 19, wherein after the step of providing a plurality of metal sheets comprises:

forming a blind via in the surface of the metal frame;

wherein the step of injecting further comprises:

filling the blind via with the molten injection liquid.

* * * * *